United States Patent
Brouhard et al.

(10) Patent No.: US 6,470,481 B2
(45) Date of Patent: *Oct. 22, 2002

(54) STATE MANAGEMENT IN A CO-VERIFICATION SYSTEM

(76) Inventors: Michael C. Brouhard, 620 Atwater Rd., Lake Oswego, OR (US) 97034; John Wilson, 19 Kelsey Avenue, Finchampstead, Wokingham, Berkshire, RG40 4TZ (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/364,004
(22) Filed: Jul. 29, 1999
(65) Prior Publication Data

US 2002/0120909 A1 Aug. 29, 2002

(51) Int. Cl.⁷ .............................................. G06F 17/50
(52) U.S. Cl. ........................................................ 716/5
(58) Field of Search .............................................. 716/5

(56) References Cited

U.S. PATENT DOCUMENTS

| | | | |
|---|---|---|---|
| 5,960,182 A | * 9/1999 | Matsuoka | 703/17 |
| 5,987,243 A | * 11/1999 | Aihara | 703/17 |
| 6,052,524 A | * 4/2000 | Pauna | 703/22 |
| 6,212,489 B1 | * 3/2001 | Klein | 703/13 |

* cited by examiner

Primary Examiner—John F. Niebling
Assistant Examiner—Stacy Whitmore
(74) Attorney, Agent, or Firm—Blakely Sokoloff Taylor & Zafman LLP

(57) ABSTRACT

A method and apparatus for state management in a co-verification system is described. The invention allows acceleration of co-simulation without loss of information that can occur from independent simulation of software and hardware components of a design. For example, counters included in a hardware component that are influenced by software components are simulated and updated by the software simulator when simulation of hardware and software is not synchronized. When the counter or other hardware component that is maintained by software simulation causes a hardware event (e.g., an interrupt) to occur, co-simulation is resynchronized and the hardware component is updated. Improved acceleration of co-simulation is thereby provided.

21 Claims, 4 Drawing Sheets

STATE MANAGEMENT IN A CO-VERIFICATION SYSTEM

FIELD OF THE INVENTION

The present invention relates to design verification systems. More particularly, the present invention relates to management of co-verification of a target design.

BACKGROUND OF THE INVENTION

Designers of complex electronic systems often use verification tools to simulate, analyze and/or verify component designs. Various technologies exist to assist the designer in this process. One co-verification scheme allows two components of a system design (e.g., hardware and software) to be simulated simultaneously and to interact with each other such that a complete system can be verified. This is referred to as "co-simulation." Other co-verification schemes include software simulation/hardware emulation.

One drawback to hardware/software co-simulation is that the typical speed at which hardware simulation can be performed is much slower that the typical speed at which software simulation can be performed. Thus, hardware simulation limits the speed of co-simulation. Relatively slow hardware simulation results in co-simulation systems that cannot provide complete design co-verification for complex designs including both hardware and software.

One solution to the limitations imposed by relatively slow hardware simulation is to "de-couple" time synchronization of hardware and software simulation in order to accelerate software simulation for selected portions of the target design verification process. The software simulation component is allowed to operate at full speed without waiting for signals to be received from the hardware simulation component. During this acceleration, the hardware simulation component is either suspended or performs simulation independent of the software simulation.

One disadvantage of this acceleration scheme is that verification details are lost because intermediate results are not communicated between the software and hardware verification components. If a hardware design includes certain hardware elements, such as timers and/or counters, that are used to trigger software events, such as interrupts, accurate co-simulation cannot be achieved if portions of the co-simulation are accelerated. Thus, in order to accomplish accurate co-simulation of a target design, full co-simulation may be required, which can be a very time consuming process.

What is needed is a method and apparatus that allows co-verification acceleration without loss of timing information.

SUMMARY OF THE INVENTION

A method and apparatus for state management in a co-verification system is described. A transition from a synchronized co-verification mode to an accelerated coverification mode is detected. In response to the transition, a first portion and a second portion of a target design are verified independently. An architectural state corresponding to the second portion is maintained based on verification of the first portion, wherein the architectural state is maintained as part of verification of the first portion. Eventually, co-verification transitions back to synchronized co-verification mode in response to a predetermined architectural state.

BRIEF DESCRIPTION OF THE DRAWINGS

The present invention is illustrated by way of example, and not by way of limitation in the figures of the accompanying drawings in which like reference numerals refer to similar elements.

DETAILED DESCRIPTION

A method and apparatus for state management in a co-verification system is described. In the following description, for purposes of explanation, numerous specific details are set forth in order to provide a thorough understanding of the present invention. It will be apparent, however, to one skilled in the art that the present invention can be practiced without these specific details. In other instances, structures and devices are shown in block diagram form in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment The invention allows acceleration of co-simulation without loss of information that can occur from independent simulation of software and hardware components of a design. For example, counters included in a hardware component that are influenced by software components are simulated and updated by the software simulator when simulation of hardware and software is not synchronized. When the counter or other hardware component that is maintained by software simulation causes a hardware event (e.g., an interrupt) to occur, co-simulation is resynchronized and the hardware component is updated. Improved acceleration of co-simulation is thereby provided.

Figure 1:
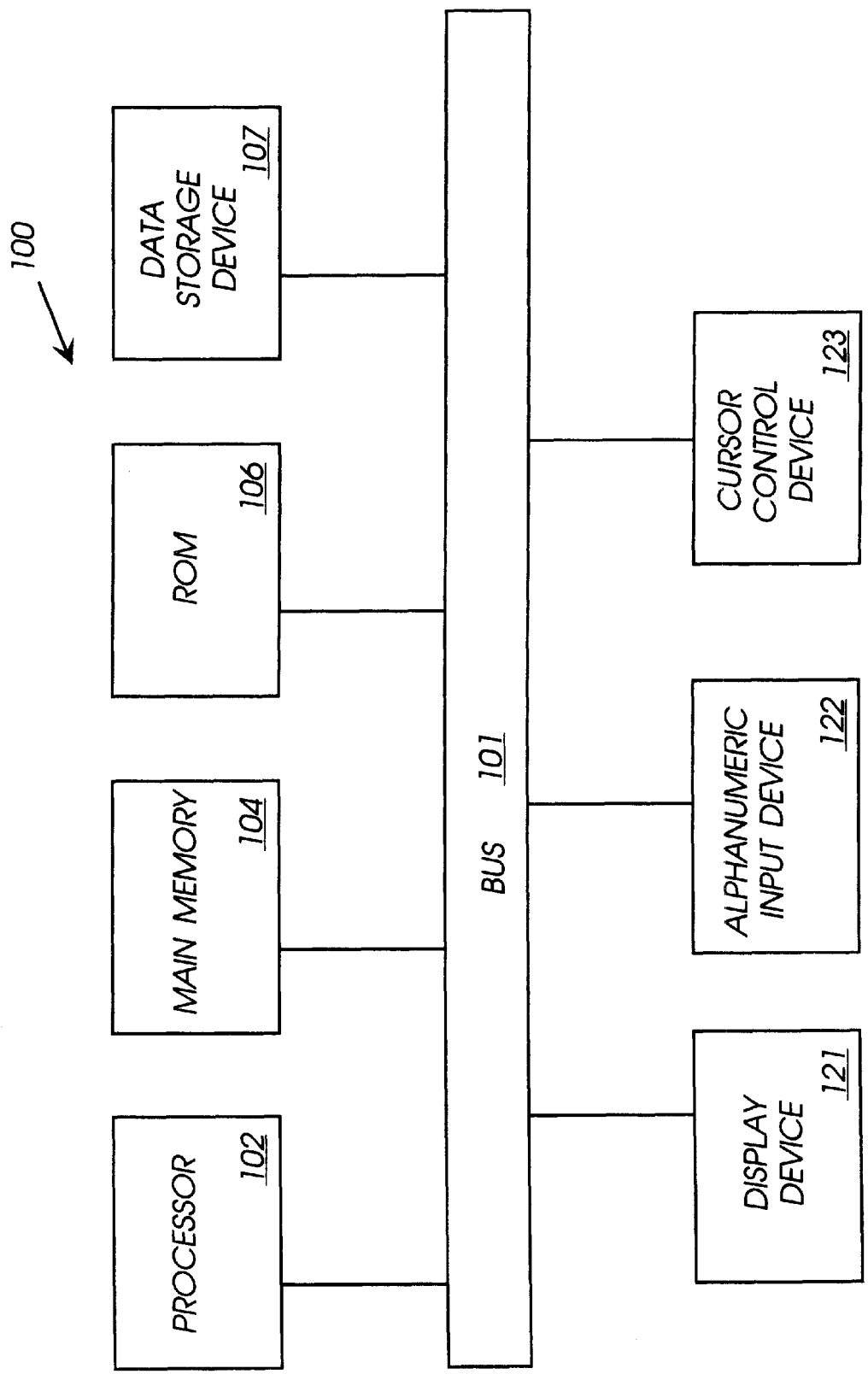
FIG. 1 is one embodiment of a system suitable for use with the invention.

FIG. 1 is one embodiment of a system suitable for use with the invention. System 100 includes bus 101 or other communication device for communicating information and processor 102 coupled to bus 101 of or processing information. While system 100 is illustrated with a single processor, system 100 can include multiple processors. System 100 further includes random access memory (RAM) or other dynamic storage device 104 (referred to as main memory), coupled to bus 101 for storing information and instructions to be executed by processor 102. Main memory 104 also can be used for storing temporary variables or other intermediate information during execution of instructions by processor 102. System 100 also includes read only memory (ROM) and/or other static storage device 106 coupled to bus 101 for storing static information and instructions for processor 102. Data storage device 107 is coupled to bus 101 for storing information and instructions.

Data storage device 107 such as a magnetic disk or optical disc and corresponding drive can be coupled to system 100. System 100 can also be coupled via bus 101 to display device 121, such as a cathode ray tube (CRT) or liquid crystal display (LCD), for displaying information to a user. Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

One embodiment of the present invention is related to the use of system 100 to all or a portion of accelerated co-verification. According to one embodiment, accelerated co-verification is provided by system 100 in response to processor 102 executing sequences of instructions contained in main memory 104.

Instructions are provided to main memory 104 from a storage device, such as magnetic disk, a read-only memory (ROM) integrated circuit (IC), CD-ROM, DVD, via a remote connection (e.g., over a network), etc. In alternative embodiments, hard-wired circuitry can be used in place of or in combination with software instructions to implement the present invention. Thus, the present invention is not limited to any specific combination of hardware circuitry and software instructions.

Figure 2:
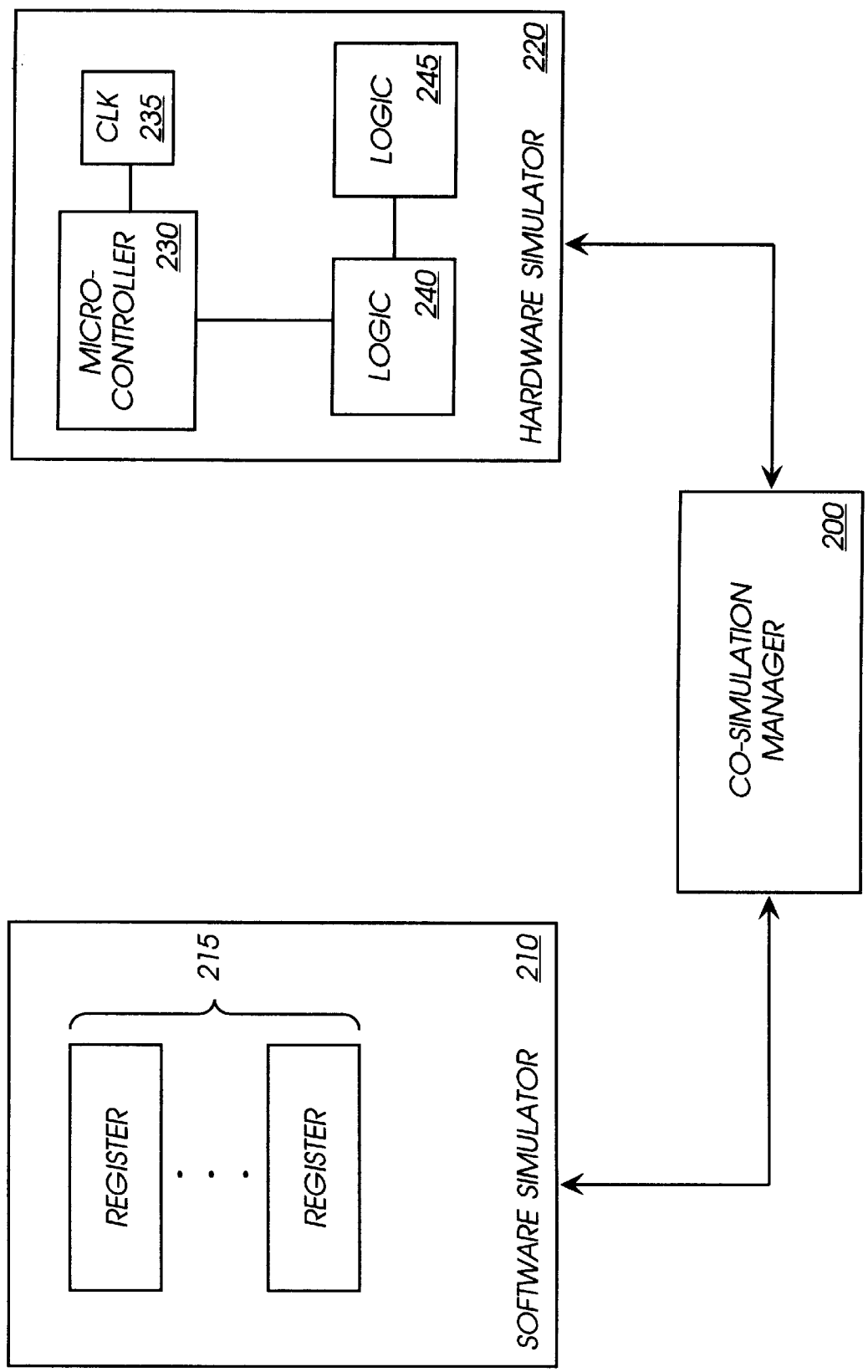
FIG. 2 is a block diagram of a co-simulation system suitable for use with the invention.

FIG. 2 is a block diagram of a co-simulation system suitable for use with the invention. In general, software simulator 210 simulates software portions of a system design and hardware simulator 220 simulates hardware portions of a system design.

Software simulator 210 and hardware simulator 220 can run on different systems, such as system 100 described above, or software simulator 210 and hardware simulator 220 can run on a common system, such as a multiprocessor computer system.

Software simulator 210 simulates execution of software instructions that are part of the design subject to verification. As the instructions are simulated, the architectural state of one or more hardware components is updated. For example, registers 215 can be updated in response to simulation of software instructions. Other registers and/or devices can be similarly maintained by software simulator 210.

Hardware simulator 220 simulates the behavior of hardware devices included in the system design being verified. This can include the external interfaces of the hardware devices as well as the internal electronic behavior of the hardware device. For example, microcontroller 230 can be a model of a well-known microcontroller that receives a clock signal from clock 235. Microcontroller 230 can provide signals to logic 240, which in turn provides signals to logic 245, where logic 240 and 245 are components being designed for the system being verified. Hardware simulator 220 can also include registers and/or devices to maintain the architectural state.

Co-simulation manager 200 coordinates the simulation performed by software simulator 210 and hardware simulator 220. For example, execution of software instructions is simulated by software manager 210 that updates registers 215 and other appropriate state values. The results of the simulated execution are communicated to co-simulation manager 200, which passes relevant information to hardware simulator 220. Hardware simulator 220 then simulates changes to input and/or output signals for the hardware being simulated. Similarly, one or more input/output signals generated by hardware simulator 220 (e.g., a clock signal) are passed to co-simulation manager 200 and back to software simulator 210.

Through communication between software simulator 210 and hardware simulator 220 managed by co-simulation manger 200, hardware and software co-simulation can be provided to verify a system design including both hardware and software components. Because simulation of hardware by hardware simulator 220 is typically much slower than simulation of software by software simulator 210, hardware simulation can act as a bottleneck to co-verification in a co-simulation environment.

Figure 3:
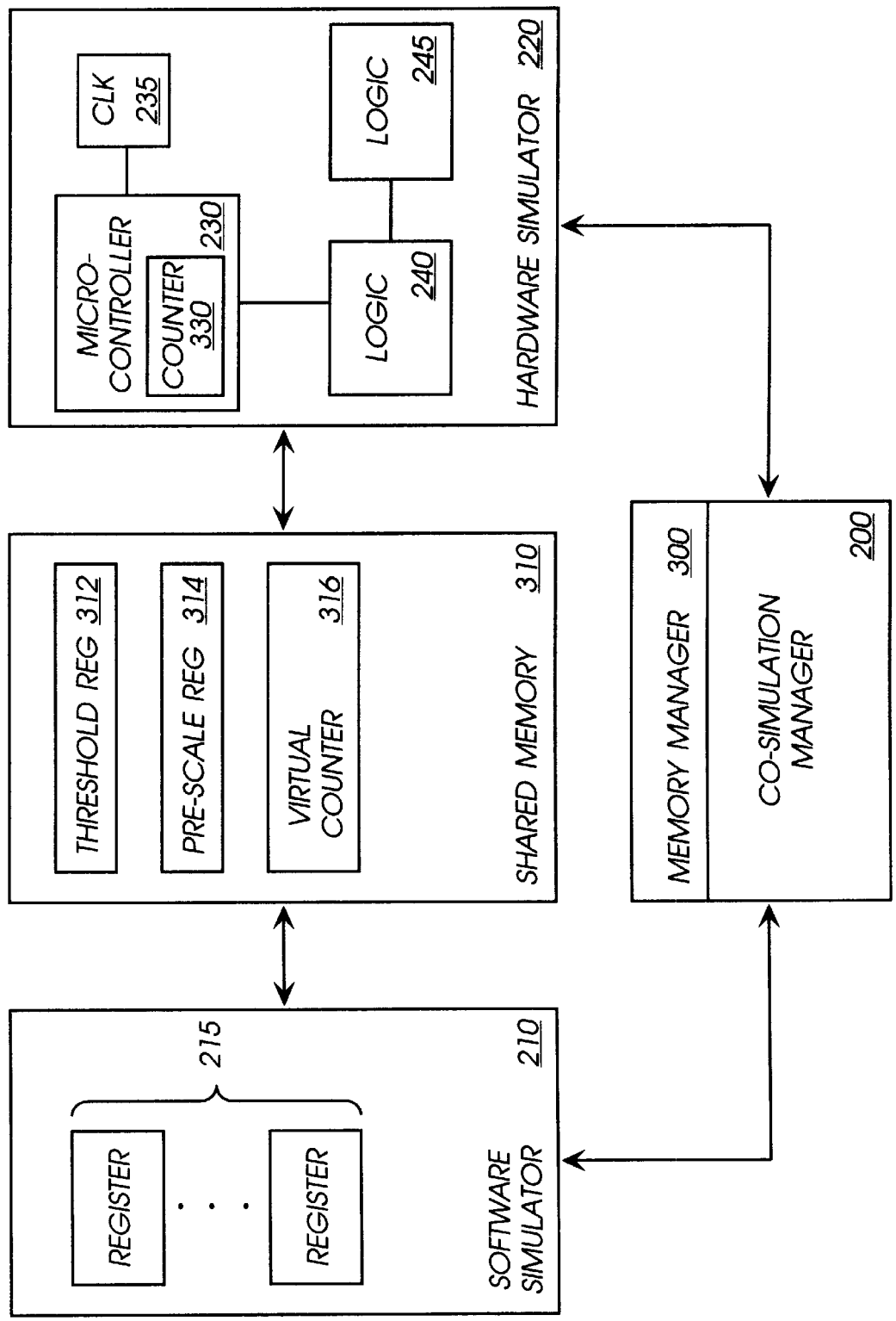
FIG. 3 is a block diagram of a co-simulation system providing state management according to the invention.

FIG. 3 is a block diagram of a co-simulation system providing state management according to the invention. The co-simulation system of FIG. 3 includes the components of FIG. 2 and additional components to support the invention. The components of FIG. 3 not shown in FIG. 2 can be used with the system of FIG. 2. For example, the co-simulation system of FIG. 2 can include a shared memory.

In one embodiment, co-simulation manager 200 includes memory manager 300. Memory manager 300 is used to simulate memory accesses by both software simulator 210 and hardware simulator 220. For example, software simulator 210 can simulate instructions assuming a zero wait state memory access. In connection with the simulation of instructions memory manager 300 can provide software simulator 210 with wait state information for various memory accesses. Memory manager 300 thereby increases the accuracy with which co-simulation can be performed.

Shared memory 310 can be accessed by both software simulator 210 and hardware simulator 220 for simulation purposes. According to one embodiment of the invention, shared memory includes threshold register 312, pre-scale register 314, and virtual counter 316, each of which are described in greater detail below. In general, virtual counter 316 corresponds to counter 330 that is part of microcontroller 230. Multiple timers with corresponding virtual timers can be supported. Also, the counter simulated by hardware simulator 220 can be in any hardware component.

Counters that are part of hardware components can be used, for example, to generate an interrupt or other event in response to a predetermined number of clock cycles or other hardware events. One scheme for accelerating co-simulation in view of the hardware simulation bottleneck described above is decouple hardware simulation from software simulation. In other words, hardware simulation is not synchronized with software simulation. However, during acceleration, changes to counter 330 are not communicated to software simulator 210. Similarly, changes in software simulator 210 that would cause counter 330 to change during synchronized co-simulation are not communicated to hardware simulator 220.

For each counter simulated by hardware simulator 220 (e.g., counter 330), a corresponding set of registers is maintained in shared memory. In one embodiment, the registers include a threshold register (e.g., 312), a pre-scale register (e.g., 314), and a virtual counter (e.g., 316). The threshold register stores a value at which an event occurs in response to the virtual counter reaching the threshold value. The pre-scale counter stores a scaling value that is used to increment the virtual counter. For example, if clock cycles are being counted and the pre-scale register stores a value of four, the virtual counter is incremented for each four clock cycles. The virtual counter maintains the value that would otherwise be stored in the hardware counter if co-simulation were synchronized.

In operation, hardware simulator 220 and software simulator 210 simulate a system design in a synchronized manner as controlled by co-simulation manager 200. In response to some event, for example, user input, co-simulation manager 200 causes simulation to enter an accelerated mode in which software simulator 210 and hardware simulator 220 operate independent of each other, or hardware simulation is suspended. When the accelerated mode is entered, a set of registers, as described above, is configured for each counter simulated by hardware simulator 220. Other architectural state can be maintained in a similar manner.

In one embodiment during accelerated simulation, software simulator 210 simulates software instructions and provides information to co-simulation manager 200 and updates the register values stored in shared memory 310 during each simulated instruction execution. Simulated execution of an instruction assumes no wait states from memory. The number of clock cycles required for execution of a particular instruction is determined by software simulator 210. For some instructions (e.g., a move instruction), the number of clock cycles can be determined. For other instructions (e.g., a floating point divide instruction), the number of clock cycles is not determined, but is estimated by software simulator 210.

As described above, memory wait state information is provided by memory manager 300. Software simulator 210 combines the number of clock cycles for an instruction to execute with wait state information from memory manager 300 and updates register values stored in shared memory 310 accordingly.

The following example assumes that threshold register 312 stores a value of zero, pre-scale register 314 stores a value of four and virtual counter 316 stores a value of two and the virtual counter is decrementing. Thus, a hardware event will be triggered after eight clock cycles. Furthermore, a range of two virtual counter ticks is used to trigger synchronized co-simulation. In other words, when the registers indicate that software simulation is within two virtual counter ticks of the triggering the hardware event, the co-simulation system returns to synchronized mode.

Software simulator 210 simulates execution of an instruction that requires six clock cycles to execute. Memory manager 300 determines that access to memory by the instruction requires one wait state. Software simulator 210 updates the registers stored in shared memory 310 based on seven clock cycles required for execution of the instruction. Thus, simulation of the instruction causes the software simulation to be one clock cycle from triggering the hardware event.

Because pre-scale register 314 stores a value of four, virtual counter 316 is decremented in response to each set of four clock cycles required for execution of an instruction. The instruction executed required seven clock cycles, so virtual counter 316 is decremented and, as a result, stores the value of one. In the example above, simulated execution of the seven-cycle instruction moves virtual counter 316 to within one clock cycle of reaching the value stored in threshold register 312 and causing the corresponding event (e.g., an interrupt).

Because simulation is within the predetermined range, co-simulation manager 200 synchronizes software simulator 210 and hardware simulator 220 and causes co-simulation to continue in synchronized mode. In order to continue in synchronized mode hardware simulator 220 updates counter 330 based on the values stored in shared memory 310. Other values may also be updated as a result of the software simulation. Also, software simulation may be suspended until hardware simulation proceeds to a state in which the hardware components of the target design can be updated based on the software simulation.

In one embodiment, co-simulation continues in synchronized mode for a predetermined number of clock cycles, or other predetermined period. Operation in synchronized mode allows the event caused by the counter to be co-simulated in synchronized mode. For example, an interrupt can be serviced before the co-simulation returns to accelerated mode.

Figure 4:
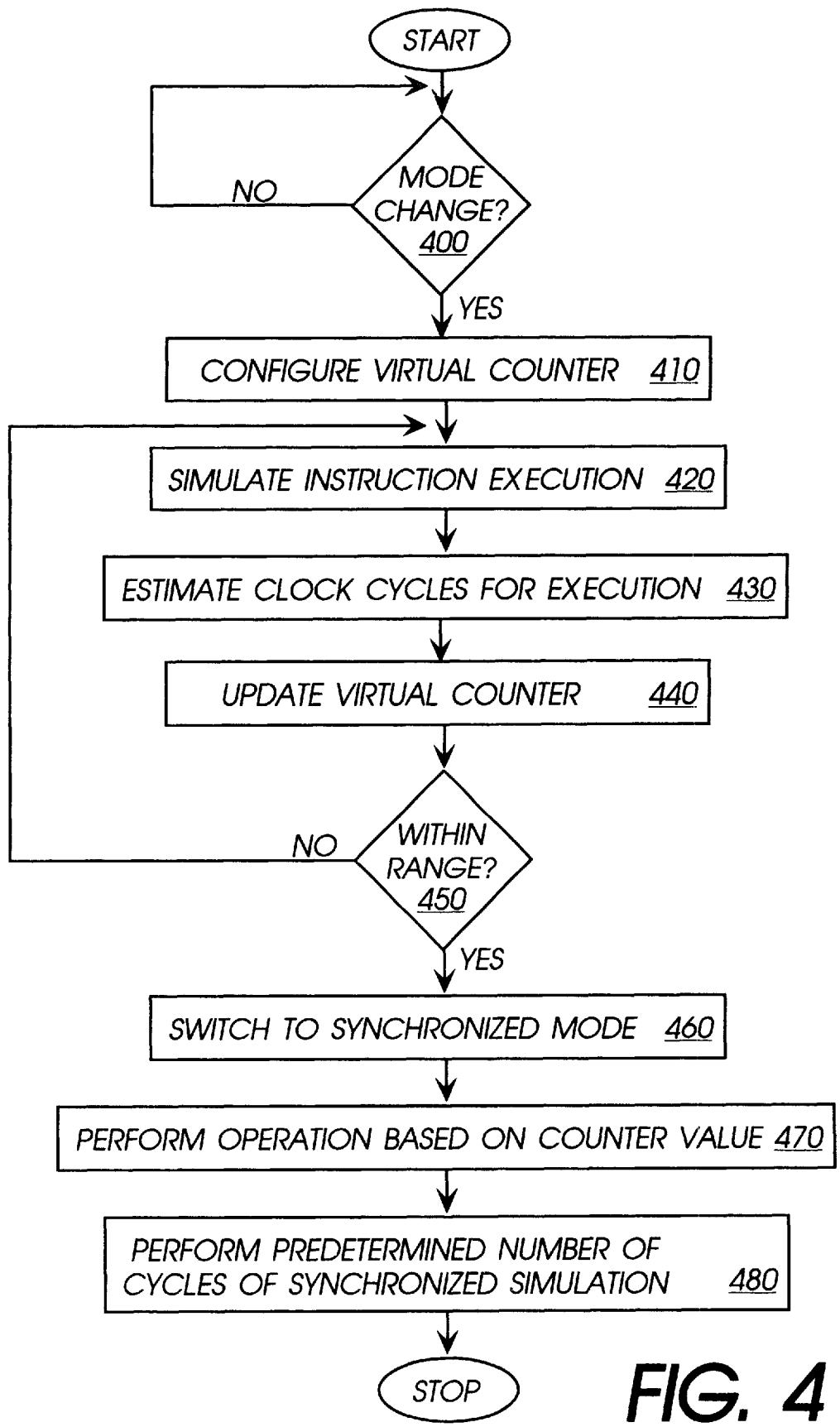
FIG. 4 is a flow diagram for state management in a co-simulation system according to one embodiment of the invention.

FIG. 4 is a flow diagram for state management in a co-simulation system according to one embodiment of the invention. The example of FIG. 4 assumes co-simulation begins in synchronized mode; however, beginning co-simulation in synchronized mode is not required to practice the invention.

The co-simulation system determines whether a mode change has occurred at 400. If a mode change occurs, a virtual counter and supporting registers are configured at 410 for each counter simulated by hardware simulator 220. In one embodiment, prior to simulation each model used by hardware simulator 220 is analyzed by co-simulation manager 200 to determine how many counters, if any, exist in the particular model and the type of counter. This information is used to configure a set of registers for supporting one or more virtual timers.

At 420, execution of an instruction is simulated by software simulator 210. The number of clock cycles required by each instruction executed is either determined or estimated at 430. The appropriate virtual counters and corresponding support registers are updated at 440. If the virtual counter is not within the predetermined range of the threshold value at 450, simulation of instructions and updating of the virtual counter (420, 430 and 440) are repeated until within the predetermined range at 450.

If within range at 450, the co-simulation system returns to synchronized mode at 460. The operation caused by the timer, for example, an interrupt, is performed at 470. In one embodiment, the co-simulation system remains in synchronized mode for a predetermined number of cycles at 480 before attempting to return to accelerated mode. Operating in synchronized mode for the predetermined number of cycles allows the co-simulation system to simulate the results of the operation caused by the counter to be performed In the foregoing specification, the present invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method comprising:
   detecting a transition from a synchronized co-verification mode to an accelerated co-verification mode, wherein a software design and a hardware design are verified independently in the accelerated co-verification mode;
   verifying the software design and the hardware design independently in response to the transition to the accelerated co-verification mode;
   maintaining an architectural state corresponding to the hardware design based on verification of the software design, wherein the architectural state corresponding to the hardware design is maintained as part of verification of the software design; and
   transitioning to the synchronized co-verification mode in response to a predetermined architectural state, wherein the software design and hardware design interact during verification in the synchronized co-verification mode.

2. The method of claim 1 further comprising operating in the synchronized co-verification mode for a predetermined period.

3. The method of claim 1 wherein verification of the software design comprises simulation of a software component of the software design.

4. The method of claim 1 wherein verification of the hardware design comprises simulation of a hardware component of the hardware design.

5. The method of claim 1 wherein maintaining an architectural state corresponding to the hardware design based on verification of the software design, wherein the architectural state corresponding to the hardware design is maintained as part of verification of the software design, further comprises:
   simulating execution of an instruction;
   updating the architectural state in response to execution of the instruction; and
   determining whether the architectural state is within a predetermined range.

6. The method of claim 5 wherein updating the architectural state further comprises:
   determining a number of clock cycles corresponding to the simulated execution of the instruction; and
   updating one or more registers based, at least in part, on the number of clock cycles.

7. An apparatus comprising:
   means for detecting a transition from a synchronized co-verification mode to an accelerated co-verification mode; wherein a software design and a hardware design are verified independently in the accelerated co-verification mode;
   means for verifying a software design and a hardware design independently in response to the transition;
   means for maintaining an architectural state corresponding to the hardware design based on verification of the software design, wherein the architectural state corresponding to the hardware design is maintained as part of verification of the software design; and
   means for transitioning to the synchronized co-verification mode in response to a predetermined architectural state, wherein the software design and hardware design interact during verification in the synchronized co-verification mode.

8. The apparatus of claim 7 further comprising means for operating in the synchronized co-verification mode for a predetermined period.

9. The apparatus of claim 7 wherein means for verification of the software design comprises simulation of a software component of the software design.

10. The apparatus of claim 7 wherein means for verification of the hardware design comprises simulation of a hardware component of the hardware design.

11. The apparatus of claim 7 wherein means for maintaining an architectural state corresponding to the hardware design based on verification of the software design, wherein the architectural state corresponding to the hardware design is maintained as part of verification of the software design, further comprises:
   means for simulating execution of an instruction;
   means for updating the architectural state in response to execution of the instruction; and
   means for determining whether the architectural state is within a predetermined range.

12. The apparatus of claim 11 wherein means for updating the architectural state further comprises:
   means for determining a number of clock cycles corresponding to the simulated execution of the instruction; and
   means for updating one or more registers based, at least in part, on the number of clock cycles.

13. An article comprising a machine-accessible medium to provide machine-readable instructions that, when executed, cause one or more electronic systems to:
   detect a transition from a synchronized co-verification mode to an accelerated coverification mode, wherein a software design and a hardware design are verified independently in the accelerated co-verification mode;
   verify a software design and a hardware design independently in response to the transition to the accelerated co-verification mode;
   maintain an architectural state of the hardware design based on verification of the software design, wherein the architectural state corresponding to the hardware design is maintained as part of the verification of the software design; and
   transition to the synchronized co-verification mode in response to a predetermined architectural state, wherein the software design and hardware design interact during verification in the synchronized co-verification mode.

14. The article of claim 13 farther comprising sequences of instructions that when executed cause the one or more processors to operate in the synchronized co-verification mode for a predetermined period.

15. The article of claim 13 wherein verification of the software design comprises simulation of a software component of the software design.

16. The article of claim 13 wherein verification of the hardware design comprises simulation of a hardware component of the hardware design.

17. The article of claim 13 wherein the instructions that cause the one or more electronic systems to maintain an architectural state corresponding to the hardware design based on verification of the software design, wherein the architectural state is maintained as part of the verification of the software design, further comprise instructions that, when executed, cause the one or more electronic systems to:
   simulate execution of an instruction;
   update the architectural state in response to execution of the instruction; and
   determine whether the architectural state is within a predetermined range.

18. The article of claim 17 wherein the instructions that cause the one or more electronic systems to update the architectural state in response to execution of the instruction further comprise instructions that, when executed, cause the one or more electronic systems to:
   determine a number of clock cycles corresponding to the simulated execution of the instruction; and
   update one or more registers based, at least in part, on the number of clock cycles.

19. A data signal embodied in a data communications medium shared among a plurality of electronic systems, the data signal transmitting content that, when accessed, cause one or more electronic systems to:
   detect a transition from a synchronized co-verification mode to an accelerated coverification mode, wherein a software design and a hardware design are verified independently in the accelerated co-verification mode;
   verify a software design and a hardware design independently in response to the transition to the accelerated co-verification mode;

maintain an architectural state of the hardware design based on verification of the software design, wherein the architectural state corresponding to the hardware design is maintained as part of the verification of the software design; and transition to synchronized co-verification mode in response to a predetermined architectural state, wherein the software design and hardware design interact during verification in the synchronized co-verification mode.

20. The data signal of claim 19 wherein the instructions that cause the one or more electronic systems to maintain an architectural state corresponding to the hardware design based on verification of the software design, wherein the architectural state corresponding to the hardware design is maintained as part of the verification of the software design, further comprise instructions that, when executed, cause the one or more electronic systems to:

simulate execution of an instruction;

update the architectural state in response to execution of the instruction; and determine whether the architectural state is within a predetermined range.

21. The data signal of claim 20 wherein the instructions that cause the one or more electronic systems to update the architectural state in response to execution of the instruction further comprise instructions that, when executed, cause the one or more electronic systems to:

determine a number of clock cycles corresponding to the simulated execution of the instruction; and update one or more registers based, at least in part, on the number of clock cycles.

* * * * *